(12) United States Patent
Kakimoto et al.

(10) Patent No.: US 8,815,714 B2
(45) Date of Patent: Aug. 26, 2014

(54) METHOD OF FORMING A GERMANIUM THIN FILM

(71) Applicant: Tokyo Electron Limited, Tokyo (JP)

(72) Inventors: Akinobu Kakimoto, Nirasaki (JP); Shigeru Nakajima, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 2 days.

(21) Appl. No.: 13/780,842

(22) Filed: Feb. 28, 2013

(65) Prior Publication Data

US 2013/0230975 A1    Sep. 5, 2013

(30) Foreign Application Priority Data

Mar. 2, 2012  (JP) .................................. 2012-46829

(51) Int. Cl.
*H01L 21/02*    (2006.01)

(52) U.S. Cl.
USPC ........................................................ 438/478

(58) Field of Classification Search
None
See application file for complete search history.

(56) References Cited

U.S. PATENT DOCUMENTS

| 7,329,593 B2 | 2/2008 | Bauer et al. |
| 7,968,434 B2 | 6/2011 | Tada et al. |

FOREIGN PATENT DOCUMENTS

| JP | 61-203633 A | 9/1986 |
| JP | 2008-544556 A | 4/2008 |
| JP | 2010-118643 A | 5/2010 |

*Primary Examiner* — Seahvosh Nikmanesh
(74) *Attorney, Agent, or Firm* — Nath, Goldberg & Meyer; Jerald L. Meyer

(57) ABSTRACT

A method of forming a germanium thin film on an underlying film includes forming a germanium seed layer by absorbing a germanium on a surface of the underlying film using an aminogermane-based gas, and forming a germanium thin film on the germanium seed layer using a germane-based gas.

10 Claims, 6 Drawing Sheets

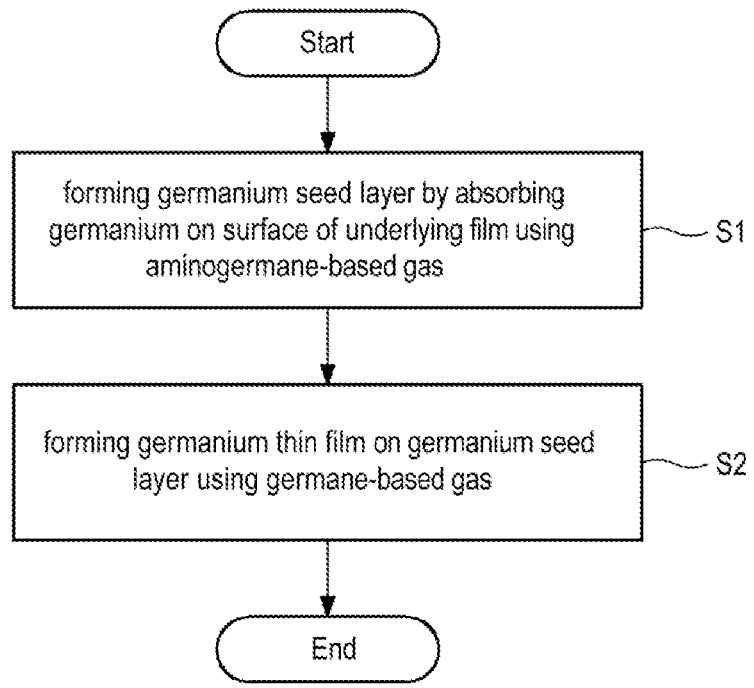

METHOD OF FORMING A GERMANIUM THIN FILM

CROSS-REFERENCE TO RELATED APPLICATION

This application claims the benefit of Japanese Patent Application No. 2012-046829, filed on Mar. 2, 2012, in the Japan Patent Office, the disclosure of which is incorporated herein in its entirety by reference.

TECHNICAL FIELD

The present disclosure relates to a method of forming a germanium thin film.

BACKGROUND

As a semiconductor material, germanium (Ge) which is a chemical element of IV group has been used in a semiconductor device. However, presently, silicon is being widely utilized.

Originally, the germanium has a carrier mobility higher than that of the silicon. As such, the germanium has again attracted attention as a material for a highly-efficient solar cell or a material for the next generation of the silicon.

Concerned in handling the germanium is how to form a germanium thin film having a smooth surface on an underlying film such as an insulation film. In view of such a circumstance, a technique which heats a substrate having an insulation film formed on a surface thereof at a first temperature, supplies a diborane ($B_2H_6$) or a mixture gas of diborane/silane ($SiH_4$) to the heated substrate, and then supplies a monogermane ($GeH_4$)-containing gas was suggested. In the technique, it has found that the germanium film is formed after fully coating the surface of the insulation film with a boron-doped silicon layer, which allows the germanium to be uniformly grown.

In other techniques, it has found that, by depositing a silicon seed layer on a silicon dioxide ($SiO_2$) substrate and continually depositing a germanium film on the silicon seed layer through a Chemical Vapor Deposition (CVD) method, a germanium film having a continuously smooth surface with a good flatness can be obtained.

As described above, in the suggested techniques, the boron-doped silicon layer or the silicon seed layer is interposed between the underlying film, such as the silicon dioxide, and the germanium film.

However, if a film other than the germanium film is interposed between the underlying film and the germanium film, the deterioration in the adhesion between the underlying film and the germanium film, the interface state occurrence, or the like can happen. That is, such a poor structure has negative effects on characteristics of semiconductor devices.

In addition, the suggested techniques may improve a surface smoothness of the germanium film. However, the techniques cannot make a thickness of the germanium film thinner while maintaining the germanium film to have a smooth surface with a good flatness and a good film thickness uniformity.

SUMMARY

The present disclosure provides to some embodiments of a method of forming a germanium thin film, which is capable of making a thickness of the germanium film thinner, while preventing a poor structure which may have negative effects on characteristics of semiconductor devices and obtaining an improved surface flatness and an improved film thickness uniformity.

According to one embodiment of the present disclosure, there is provided a method of forming a germanium thin film on an underlying film which comprises forming a germanium seed layer by absorbing a germanium on a surface of the underlying film using an aminogermane-based gas, and forming a germanium thin film on the germanium seed layer using a germane-based gas.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flow chart showing an example of a method of forming a germanium thin film according to one embodiment of the present disclosure.

FIG. 2A is a cross sectional view showing main steps of an example of a method of forming a germanium thin film according to one embodiment of the present disclosure.

DETAILED DESCRIPTION

Figure 2B:
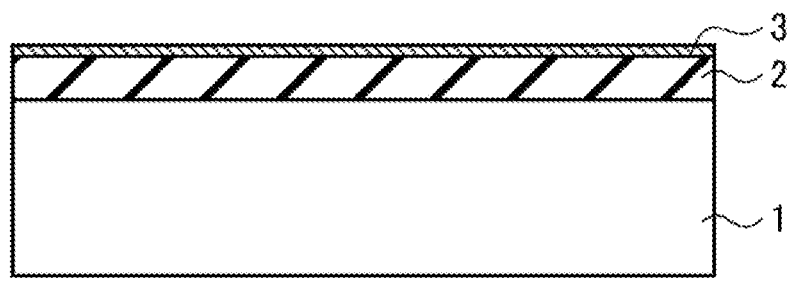
FIG. 2B is a cross sectional view showing main steps of one example of a method of forming a germanium thin film according to one embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described in detail with reference to the accompanying drawings. In the drawings, like reference numerals denote like elements.

Figure 2C:
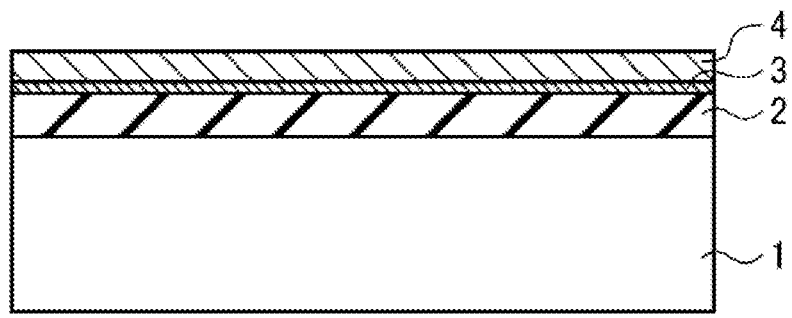
FIG. 2C is a cross sectional view showing main steps of one example of a method of forming a germanium thin film according to one embodiment of the present disclosure.

FIG. 1 is a flow chart showing an example of a method of forming a germanium thin film according to one embodiment of the present disclosure, FIGS. 2A to 2C are cross sectional views showing main steps of the method, and FIGS. 3A to 3G are schematic views showing a state of a film.

Figure 3A:
FIG. 3A is a schematic view showing a state of a film.

This embodiment is directed to a method of forming a germanium thin film on an underlying film. In this embodiment, a silicon oxide ($SiO_2$) film 2 formed on a silicon substrate (silicon wafer=single crystalline silicon) 1 is used as an example of the underlying film (see FIG. 2A). The underlying film is not limited only to the silicon oxide film 2. For example, a film which has a surface with the sufficient moisture may be used as the underlying film. As shown in FIG. 3A, an example of the moisture may be selected from a hydroxyl group (OH). In forming the silicon oxide film 2 whose surface includes the hydroxyl group, for example, a chemical vapor deposition using a hydrogen-containing gas, such as a silane-based gas, as a source gas for a silicon or a silicon oxidation in an atmosphere containing hydrogen, e.g., a water vapor, and so on, may be utilized.

Subsequently, as shown in process S1 of FIG. 1 and FIG. 2B, a germanium seed layer 3 is formed by absorbing the germanium on the surface of the silicon oxide film 2 using aminogermane-based gas. In this embodiment, $GeH(NMe_2)_3$ gas is used as the aminogermane-based gas.

An example of process conditions when the germanium seed layer 3 is formed, is as follows:
$GeH(NMe_2)_3$ Flow Rate: 500 sccm,
Process time: 1 min,
Process Temperature: 300 degrees C., and
Process Pressure: 133 Pa (1 Torr).

The moisture, e.g., the hydroxyl group, is contained on the surface of the silicon oxide film 2. When the aminogermane-based gas is supplied on the surface of the silicon oxide film 2 under the above process conditions, "hydrogen (H)" is separated from the hydroxyl group contained on the surface of the silicon oxide film 2. Further, both "nitrogen (N)" and "hydrocarbon group ($C_xH_y$)" are separated from the germanium (Ge) of the aminogermane-based gas. The separated hydrogen, nitrogen and hydrocarbon group are chemically bonded to form an "amine ($C_xH_yN$)", which is volatilized. Then, a dangling bond of "oxygen (O)" of the surface of the silicon oxide film 2 is coupled with a dangling bond of "germanium (Ge)" of the aminogermane-based gas from which the nitrogen (N) and the hydrocarbon group ($C_xH_y$) are separated. In this manner, the germanium seed layer 3 containing the germanium is formed on the surface of the silicon oxide film 2 (see FIGS. 3B and 3C).

Figure 3B:
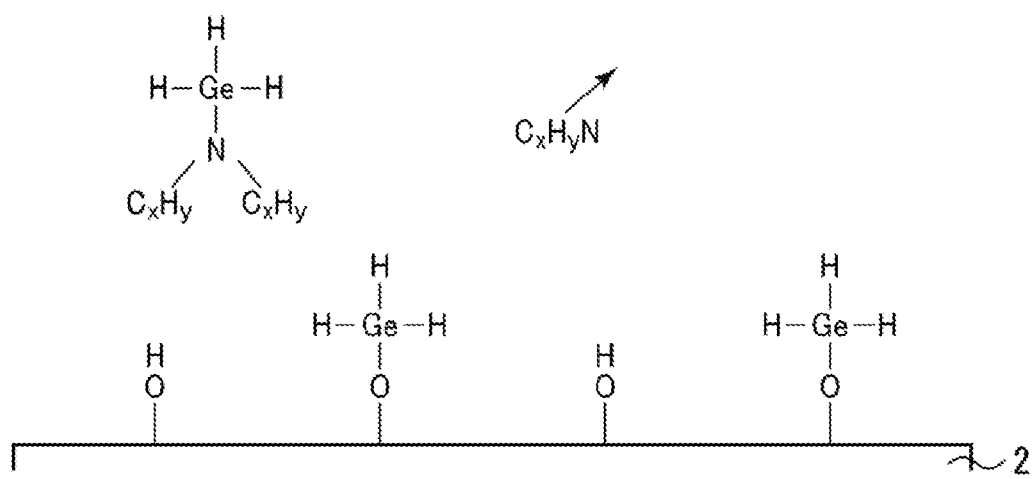
FIG. 3B is a schematic view showing a state of a film.
Figure 3C:
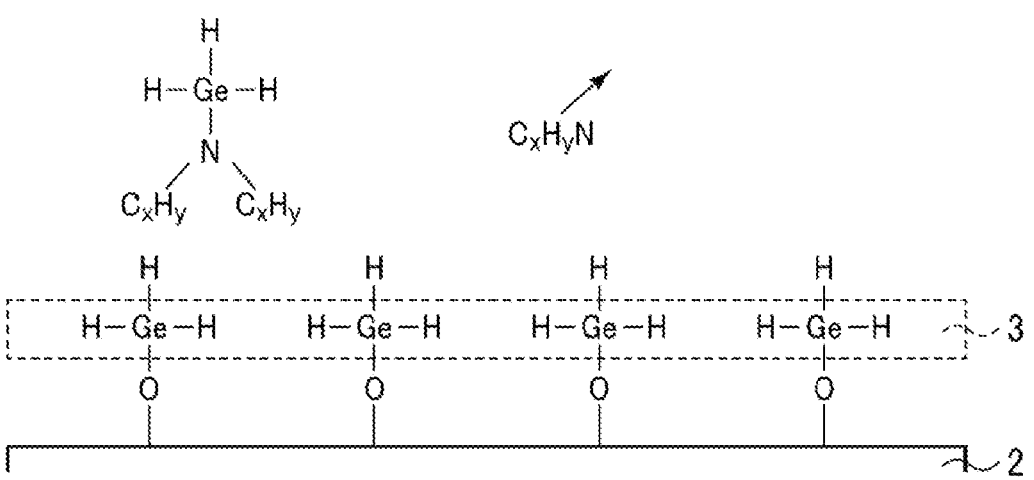
FIG. 3C is a schematic view showing a state of a film.
Figure 3D:
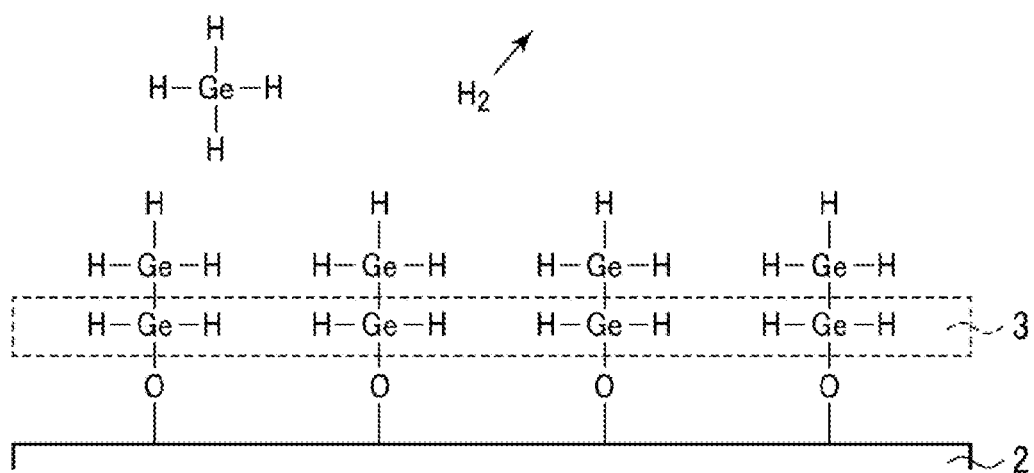
FIG. 3D is a schematic view showing a state of a film.
Figure 3E:
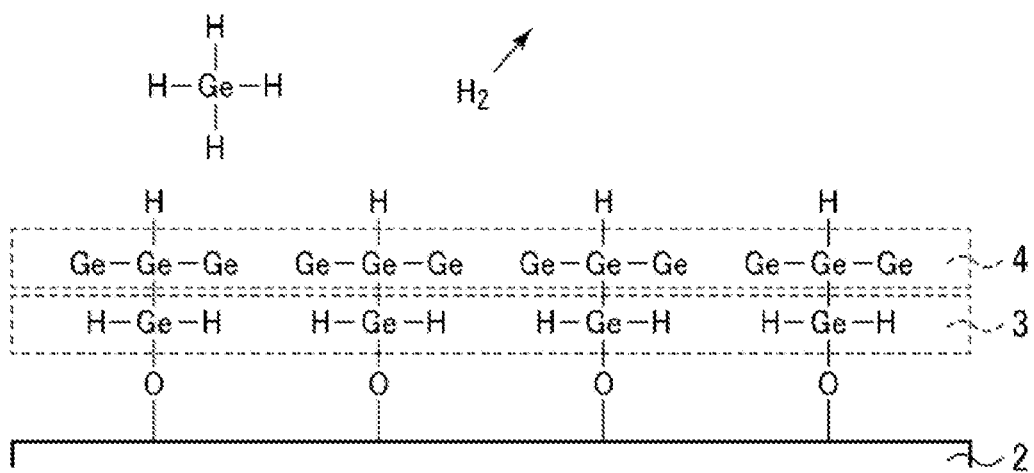
FIG. 3E is a schematic view showing a state of a film.
Figure 3F:
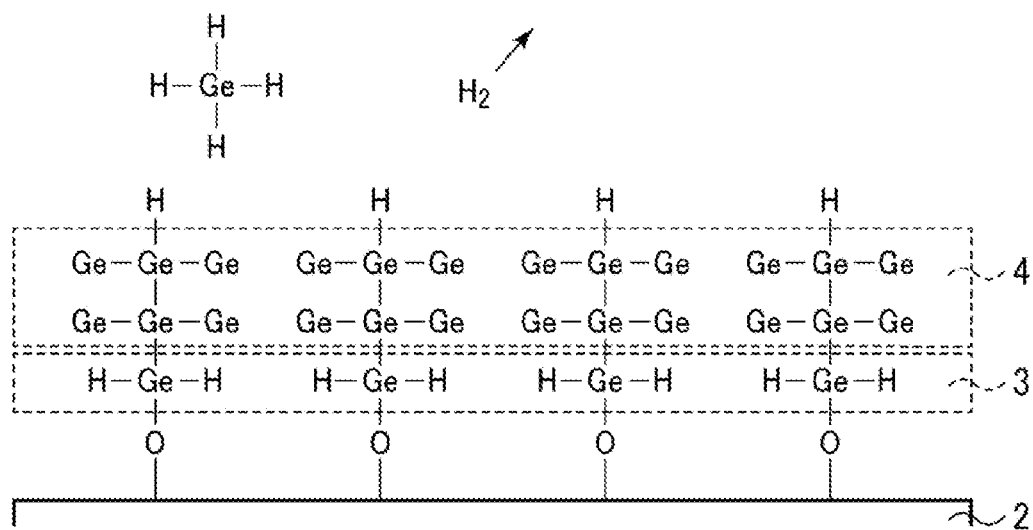
FIG. 3F is a schematic view showing a state of a film.
Figure 3G:
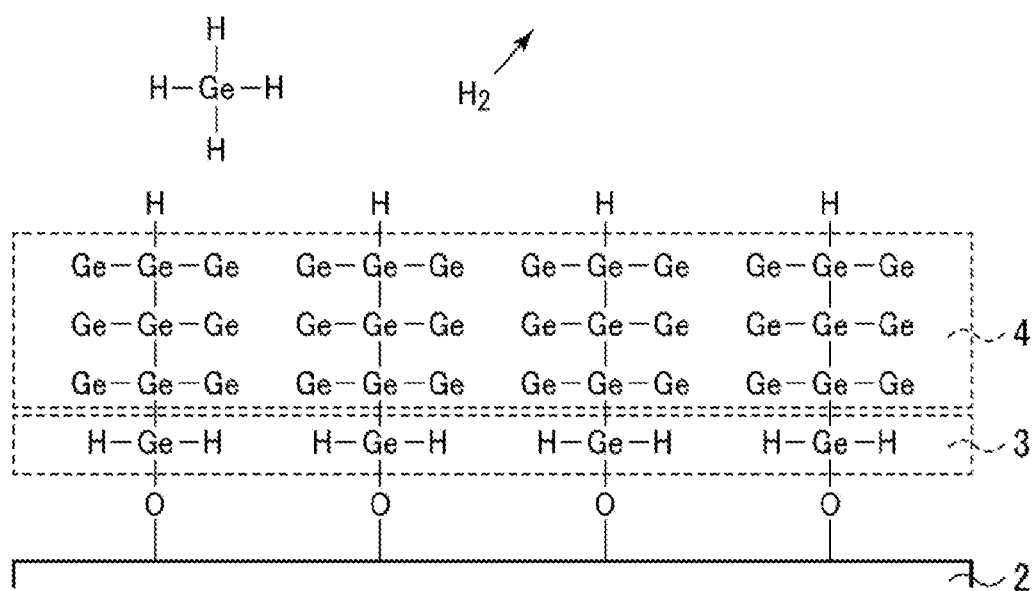
FIG. 3G is a schematic view showing a state of a film.

The germanium seed layer 3 may be formed, e.g., in a thickness range of a monoatomic layer to several atomic layers so that the germanium is absorbed on the surface of the silicon oxide film 2 (see FIGS. 3B and 3C). A specific dimension of the thickness may range from 0.1 to 3 nm.

Further, in FIGS. 3B and 3C, for the sake of simplicity, gas having a structure such as $GeH_3(NMe_2)$ is shown as the aminogermane-based gas.

Thereafter, as shown in process S2 of FIG. 1 and FIG. 2C, a germanium thin film 4 is formed on the germanium seed layer 3 using germane-based gas. In this embodiment, $GeH_4$ gas is used as the germane-based gas.

An example of process conditions when the germanium thin film 4 is formed, is as follows:
$GeH_4$ Flow Rate: 10 to 2000 sccm,
Process time: 60 min,
Process Temperature: 200 to 500 degrees C., and
Process Pressure: 13.3 to 1333.2 Pa (0.1 to 10 Torr).

If the germane-based gas is supplied to the surface of the germanium seed layer 3 under the above process conditions, "hydrogen (H)" is separated from the germanium seed layer 3, and "hydrogen (H)" is separated from germanium (Ge) of the germane-based gas. The separated hydrogens are chemically bonded to form a "hydrogen gas ($H_2$)," which is volatilized. Then, a dangling bond of "germanium (Ge)" of the germanium seed layer 3 is coupled with a dangling bond of "germanium (Ge)" of the germane-based gas from which the hydrogen (H) is separated. In this manner, the germanium thin film 4 containing the germanium is formed on the germanium seed layer 3 (see FIGS. 3D and 3E). Further, such chemical reaction continues while forming the germanium thin film 4, which allows a thickness of the germanium thin film 4 to be increased to a desired value (see FIGS. 3F and 3G).

In some embodiments, a thickness of the germanium thin film 4 may be set to various values, if desired. Further, as described later, when the germanium thin film 4 is formed according to this embodiment, the germanium thin film having a thin thickness with a good surface flatness and good film thickness uniformity may be achieved. Thus, the germanium thin film 4 may have a thin film thickness, e.g., in the range of a monoatomic layer to several atomic layers. In some embodiments, the thickness of the germanium thin film 4 may range from 1 to 50 nm. In such a film thickness range, the germanium thin film would be practical.

Figure 4:
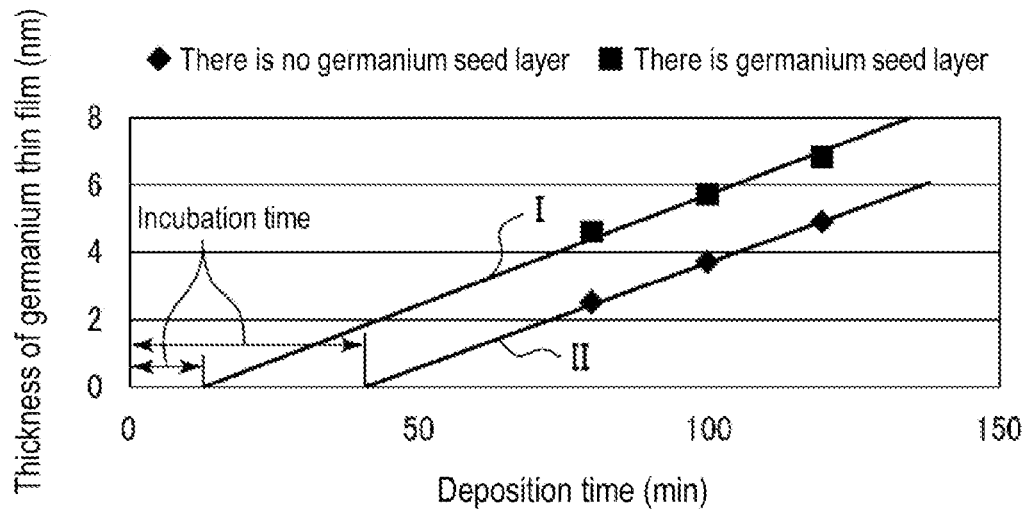
FIG. 4 is a graph showing the relationship between a thickness of a germanium thin film and a deposition time.

FIG. 4 is a graph showing the relationship between a thickness of a germanium thin film 4 and a deposition time.

In FIG. 4, a line I represents the germanium thin film 4 which is formed according to the aforementioned embodiment, and a line II represents a comparative example where a germanium thin film is directly formed on a silicon oxide film without forming a germanium seed layer.

As shown in FIG. 4, it was found that the germanium thin film 4 which is formed according to the embodiment (line I) has a deposition starting time earlier than that of the germanium thin film according to the comparative example (line II). Specifically, the germanium thin film 4 formed according to the embodiment has a short period of incubation time. The incubation time of this embodiment which is shorter than that of the comparative example means that "nucleus", which are seeds for growth of the germanium thin film 4, are densely and uniformly formed. In some embodiments, the nucleus is not distributed in an island pattern throughout the germanium seed layer 3, but is formed in a layer pattern or a pattern close to the layer pattern.

In these embodiments, due to the nucleus formed in the layer pattern or the pattern close thereto as described above, the flatness of the germanium thin film 4 can be improved when the thickness of the germanium thin film 4 reaches, e.g., the range of the monoatomic layer to the several atomic layers. Also, the thickness uniformity of the germanium thin film 4 can be improved when the thickness of the germanium thin film 4 reaches, e.g., the range of the monoatomic layer to the several atomic layers.

In addition, in the above embodiment, the germanium seed layer 3, which is formed as a seed layer on the silicon oxide film 2, is the same kind of film as the germanium thin film 4. Thus, this prevents a poor structure which has negative effects on characteristics of the semiconductor device, when compared with the comparative example where a germanium film is formed on a seed layer made of material such as silicon other than the germanium.

Therefore, the present disclosure can provide a method of forming a germanium thin film, which is capable of making the thickness of the germanium film thinner, while preventing a poor structure which has negative effects on characteristics of semiconductor devices, and obtaining an improved surface flatness and an improved film thickness uniformity.

While certain embodiments of the present disclosure have been described, the present disclosure is not limited to these embodiments and may be modified in various ways without departing from the spirit of the disclosures.

For example, although specific process conditions are illustrated in the above embodiment, the process conditions are not limited thereto.

In addition, the silicon oxide film 2 has been described to be used as the underlying film. However the underlying film is not limited thereto. For example, a silicon nitride film, a polycrystalline silicon film or a silicon substrate may be used as the underlying film. Alternatively, a metal film formed of metal such as tungsten (W), copper (Cu), titanium (Ti), titan nitride (TiN) or the like, which constitutes an internal wiring layer, may be used as the underlying film. Further alternatively, a dielectric film having a dielectric constant higher than that of the silicon oxide film, e.g., a tantalum oxide film, which is used as a dielectric film for a capacitor, may be used as the underlying film. Here, the surface of the underlying film has preferably at least moisture, e.g., the hydroxyl group.

Figure 5:
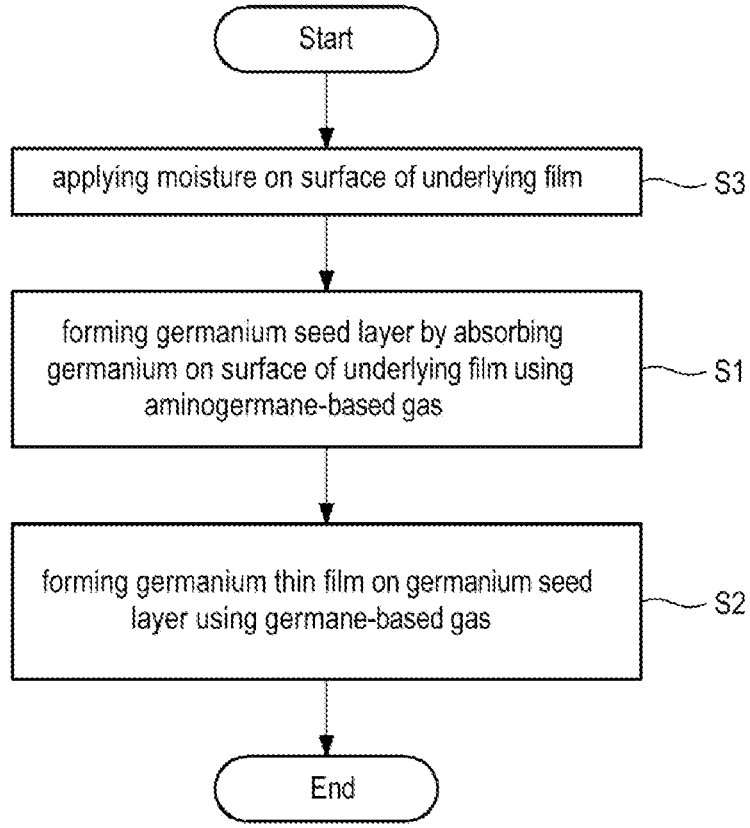
FIG. 5 is a flow chart showing one example of a method of forming a germanium thin film according to some embodiment of the present disclosure.

In some embodiments, for example, as shown in FIG. 5, applying moisture on the surface of the underlying film (process S3) before forming the germanium seed layer 3 may be further prepared.

Examples of the process S3 may include: (1) exposing the underlying film in a moisture-containing gas; (2) washing the underlying film with water; and others.

Further, in the process (1), atmosphere may be used as the moisture-containing gas. In this case, applying the moisture on the surface of the underlying film may be, for example, exposing the silicon substrate 1 on which the silicon oxide film 2 is formed as the underlying film to the atmosphere.

In addition to $GeH(NMe_2)_3$ which described to be used as the aminogermane-based gas in the above embodiment, the following aminogermane-based gases may be used:
$GeH(NMeEt)_3$,
$GeH(NEt_2)_3$,
$GeH(NHEt)_3$,
$GeH(NHi-Pr)_3$,
$GeH(NHt-Bu)_3$,
$GeH_2(NMe_2)_2$,
$GeH_2(NMeEt)_2$,
$GeH_2(NEt_2)_2$,
$GeH_2(NHEt)_2$,
$GeH_2(NHi-Pr)_2$,
$GeH_2(NHt-Bu)_2$,
$GeH_3(NMe_2)$,
$GeH_3(NMeEt)$,
$GeH_3(NEt_2)$,
$GeH_3(NHEt)$,
$GeH_3(NHi-Pr)$, and
$GeH_3(NHt-Bu)$.

When forming the germanium seed layer 3, gas containing at least one selected from a group consisting of $GeH(NMe_2)_3$ and the above gases may be used.

Further, when forming the germanium seed layer 3, a digermanium ($Ge_2H_6$) may be used.

In the aforementioned gas group, Me, Et, i-Pr, and t-Bu represent a methyl group, an ethyl group, an isopropyl group, and a tertiary butyl group, respectively.

In addition to $GeH_4$ described to be used as the germane-based gas in the above embodiment, the following germane-based gases may be used:
$Ge_2H_6$,
$GeCl_4$,
$GeHCl_3$,
$GeH_2Cl_2$, and
$GeH_3Cl$.

When forming the germanium thin film 4, gas containing at least one selected from a group consisting of $GeH_4$ and the above gases may be used.

Further, the germanium thin film 4 may be doped with a dopant. Examples of the dopant may include the following elements:
Boron (B),
Phosphorus (P),
Arsenic (As),
Oxygen (O),
Carbon (C), and
Nitrogen (N).

As to a timing for doping the dopant on the germanium thin film 4, at least one selected from the dopant group may be mixed in atmosphere at which the germanium thin film 4 is being formed, or at least one selected from the dopant group may be doped on the formed germanium thin film 4.

According to the present disclosure in some embodiments, it is possible to provide a method of forming a germanium thin film, which is capable of making a thickness of the germanium film thinner, while preventing a poor structure which has negative effects on characteristics of semiconductor devices, and obtaining an improved surface flatness and an improved film thickness uniformity.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a germanium thin film on an underlying film, the method comprising:
   forming a germanium seed layer by absorbing a germanium on a surface of the underlying film using an aminogermane-based gas; and
   forming a germanium thin film on the germanium seed layer using a germane-based gas.

2. The method of claim 1, wherein the surface of the underlying film contains moisture.

3. The method of claim 1, further comprising applying moisture on the surface of the underlying film before forming the germanium seed layer.

4. The method of claim 3, wherein applying the moisture includes exposing the underlying film to a moisture-containing gas.

5. The method of claim 4, wherein the moisture-containing gas is atmosphere.

6. The method of claim 3, wherein applying moisture includes washing the underlying film with water.

7. The method of claim 2, wherein the moisture is selected from a hydroxyl group.

8. The method of claim 1, wherein the aminogermane-based gas includes at least one selected from a group consisting of the following gases:
$GeH(NMe_2)_3$,
$GeH(NMeEt)_3$,
$GeH(NEt_2)_3$,
$GeH(NHEt)_3$,
$GeH(NHi-Pr)_3$,
$GeH(NHt-Bu)_3$,
$GeH_2(NMe_2)_2$,
$GeH_2(NMeEt)_2$,
$GeH_2(NEt_2)_2$,
$GeH_2(NHi-Pr)_2$, $GeH_2(NHt\text{-}Bu)_2$,
$GeH_3(NMe_2)$,
$GeH_3(NMeEt)$,
$GeH_3(NEt_2)$,
$GeH_3(NHEt)$,
$GeH_3(NHi\text{-}Pr)$, and
$GeH_3(NHt\text{-}Bu)$.

9. The method of claim 1, wherein the germane-based gas includes at least one selected from a group consisting of the following gases:
$GeH_4$,
$Ge_2H_6$,
$GeCl_4$,
$GeHCl_3$,
$GeH_2Cl_2$, and
$GeH_3Cl$.

10. The method of claim 1, wherein the germanium thin film is doped with a dopant containing at least one selected from a group consisting of the following elements:
Boron (B),
Phosphorus (P),
Arsenic (As),
Oxygen (O),
Carbon (C), and
Nitrogen (N).

* * * * *